United States Patent
Takayama et al.

(10) Patent No.: US 7,589,606 B2
(45) Date of Patent: *Sep. 15, 2009

(54) ELECTRONIC PART UTILIZING A PROTECTIVE FILM ON A COMB-SHAPED ELECTRODE

(75) Inventors: Ryouichi Takayama, Osaka (JP); Yukio Iwasaki, Osaka (JP)

(73) Assignee: Panasonic Corporation, Osaka (JP)

( * ) Notice: Subject to any disclaimer, the term of this patent is extended or adjusted under 35 U.S.C. 154(b) by 201 days.

This patent is subject to a terminal disclaimer.

(21) Appl. No.: 11/631,376

(22) PCT Filed: Jun. 29, 2005

(86) PCT No.: PCT/JP2005/011942

§ 371 (c)(1),
(2), (4) Date: Dec. 29, 2006

(87) PCT Pub. No.: WO2006/003933

PCT Pub. Date: Jan. 12, 2006

(65) Prior Publication Data

US 2007/0241840 A1 Oct. 18, 2007

(30) Foreign Application Priority Data

Jun. 30, 2004 (JP) .............................. 2004-193651

(51) Int. Cl.
*H03H 9/145* (2006.01)
*H03H 9/25* (2006.01)
*H03H 9/64* (2006.01)

(52) U.S. Cl. .................... 333/193; 310/312; 310/313 B

(58) Field of Classification Search ......... 333/193–196; 310/312, 313 B
See application file for complete search history.

(56) References Cited

U.S. PATENT DOCUMENTS

| 5,923,231 | A | 7/1999 | Ohkubo et al. |
| 6,677,696 | B1 * | 1/2004 | Ruile ..................... 310/313 A |
| 7,209,018 | B2 * | 4/2007 | Nakao et al. ................ 333/195 |

(Continued)

FOREIGN PATENT DOCUMENTS

JP   61-117913   6/1986

(Continued)

OTHER PUBLICATIONS

Japanese Office Action issued Jun. 30, 2009 in connection with JP Application No. 2006-528745 (with partial English translation).

*Primary Examiner*—Barbara Summons
(74) *Attorney, Agent, or Firm*—Wenderoth, Lind & Ponack L.L.P.

(57) ABSTRACT

An electronic part includes a substrate, a comb-shaped electrode having a plurality of electrode fingers arranged parallel to one another on the upper surface of the substrate, and a protective film formed on the upper surface of the substrate so as to cover the comb-shaped electrode. The protective film has convex portions and concave portions. The convex portions are upwardly convex at the positions corresponding to the electrode fingers, and the concave portions are downwardly concave between the convex portions. The cross section of the protective film in the direction orthogonal to the extending direction of the electrode fingers has a downward convex curve between apex portions of the convex portions.

12 Claims, 7 Drawing Sheets

U.S. PATENT DOCUMENTS 7,345,400 B2 * 3/2008 Nakao et al. ............ 310/313 A
2004/0050687 A1   3/2004 Lee et al.

FOREIGN PATENT DOCUMENTS

| JP | 9-107268 | | 4/1997 |
|---|---|---|---|
| JP | 9-167936 | | 6/1997 |
| JP | 9-186542 | | 7/1997 |
| JP | 10-126207 | * | 5/1998 |
| JP | 11-87655 | | 3/1999 |
| JP | 2001-111377 | | 4/2001 |
| JP | 2004-023201 | * | 1/2004 |
| JP | 2004-107688 | | 4/2004 |
| JP | 2004-172990 | * | 6/2004 |
| WO | 96/04713 | | 2/1996 |

* cited by examiner

Lb ≒ Pa

Lc < Pa/2

Ld < Pa/4

Le ≒ 0

ELECTRONIC PART UTILIZING A PROTECTIVE FILM ON A COMB-SHAPED ELECTRODE

TECHNICAL FIELD

The present invention relates to an electronic part such as a surface acoustic wave device, and a manufacturing method thereof.

BACKGROUND ART

Hereinafter, a conventional electronic part will be described.

In the prior art, a surface acoustic wave device (hereinafter, called as "SAW device") is described as an example of an electronic part.

In recent years, a compact and lightweight SAW device is prevalently used for electronic equipment such as various types of mobile communication terminal equipment. In particular, in a radio circuit section of a mobile phone system within a band of 800 MHz to 2 GHz, an SAW filter has been widely used. Such an SAW filter is formed by a lithium tantalate (hereinafter, called as "LT") substrate which is cut of a Y-axis at a cut angle of 36° as its rotational angle around the X-axis in the Z-axis direction, or a so-called 36° Y-cut X-propagation LT (hereinafter, called as "36° YLT") substrate. However, depending on a place at which a filter is used in a mobile phone system or its radio circuit section, filter characteristics are required, such as a small insertion loss within a further passing band and a steep skirt property of the filter, as well as a high suppression level within a block band. In order to meet such demands, there is a method in which an LT substrate is used that is cut of a Y-axis at a cut angle of 42° as its rotational angle around the X-axis in the Z-axis direction, or a so-called 42° Y-cut X-propagation LT (hereinafter, called as "42° YLT") substrate is used. According to this method, an SAW filter can be realized which has a smaller loss and a steeper filter skirt property than those of the conventional 36° YLT substrate. Such a method is described in Japanese Unexamined Patent Publication No. 9-167936.

However, similarly to the conventional 36° YLT substrate, such a 42° YLT substrate has a great thermal expansion coefficient in the direction where a surface acoustic wave is propagated. Besides, the elastic constant itself varies according to the temperature. Thereby, the frequency characteristics of a filter may also be largely shifted by approximately −36 ppm/° K. according to a change in the temperature. This is disadvantageous in temperature coefficient. For example, taking a PCS (Personal Communications Service) transmission filter from the United States into account, its center frequency of 1.88 GHz at the room temperature changes by about ±3.3 MHz or some 6.6 MHz within a range of ±50° C. at the room temperature. In the case of the PCS, there is an interval of only 20 MHz between its transmission band and reception band. Hence, also considering the dispersion of frequencies in its production, in practice, the transmission and reception interval is only substantially 10 MHz for the filter. Thus, for example, if the transmission band is desired to be secured over the entire temperature (i.e., within the whole range of ±50° C. at the room temperature), an adequate attenuation value cannot be obtained on the reception side.

In addition to the above, an improvement on the temperature coefficient is provided by forming an insulating film on a comb-shaped electrode. Normally, the shape of the comb-shaped electrode appears as the shape of the insulating film. Accordingly, unwanted reflection occurs at edges of concave portions of the insulating film, which may degrade electric characteristics of the filter.

Patent documents Japanese Unexamined Patent Publication No. 9-167936 and International Patent Publication Pamphlet No. 96/04713 are known, for instance, as prior art document information relating to the invention of this application.

SUMMARY OF THE INVENTION

In order to solve the above described conventional disadvantages, it is an object of the present invention to provide an electronic part having superior temperature coefficient and electric characteristics by forming a protective film on an electrode.

In order to attain the above object, one aspect of the present invention is directed to an electronic part comprising: a substrate; a comb-shaped electrode having a plurality of electrode fingers arranged parallel to one another on an upper surface of the substrate; and a protective film formed on the upper surface of the substrate in such a manner as to cover the comb-shaped electrode, wherein the protective film has convex portions and concave portions in cross section in a direction orthogonal to an extending direction of the electrode fingers, the convex portions being upwardly convex at positions corresponding to the electrode fingers, and the concave portions having a downward convex curve between apex portions of the convex portions.

According to the invention, the electronic part with superior temperature coefficient and electric characteristics can be obtained by forming the protective film in such a manner as to cover the electrode formed on the substrate, and by forming the protective film into a predetermined shape.

DETAILED DESCRIPTION OF THE INVENTION

Figure 1A:
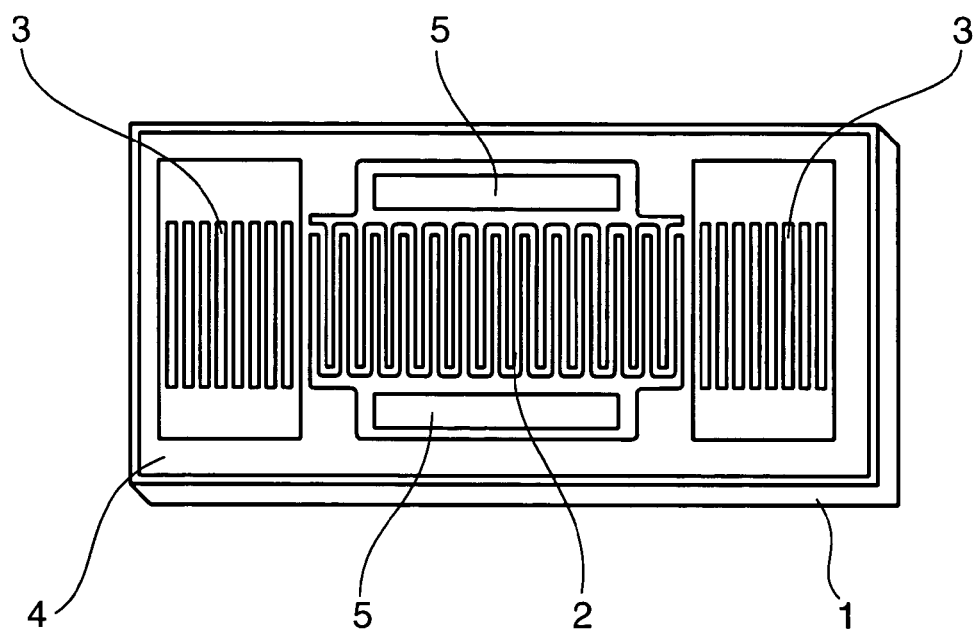
FIG. 1A is a top plan view of an SAW device in a first embodiment of the invention.

In the following, an electronic part according to an embodiment of the invention is described referring to the drawings.

In the embodiment, an SAW device is described as an example of the electronic part.

First Embodiment

In this section, the invention is described by way of the first embodiment.

Figure 1B:
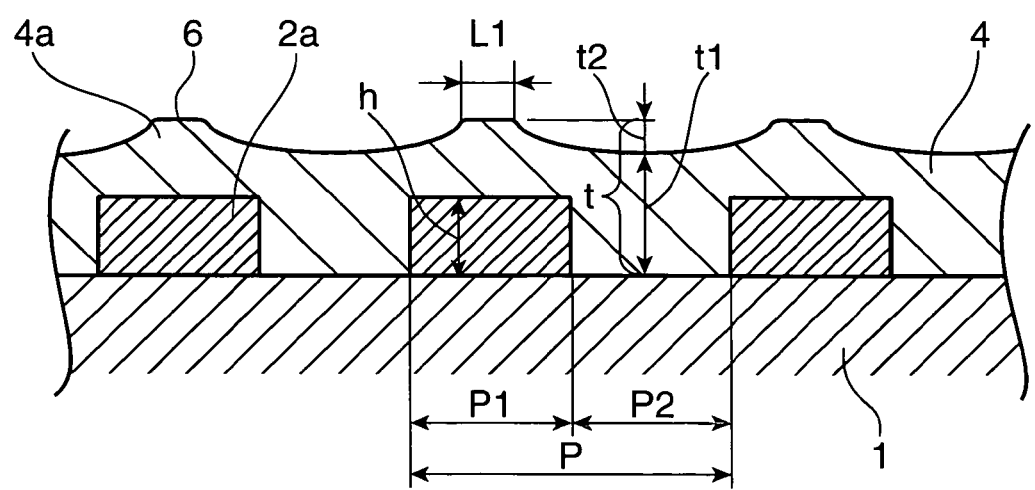
FIG. 1B is a cross-sectional view of FIG. 1A.

FIG. 1A is a top plan view of an SAW device, as the electronic part in the first embodiment of the invention, and FIG. 1B is a cross-sectional view of FIG. 1A.

As shown in FIGS. 1A and 1B, the SAW device in the first embodiment includes: a comb-shaped electrode 2 having a plurality of electrode fingers 2a arranged parallel to one another on the upper surface of a substrate 1; reflective electrodes 3 disposed on both sides of the comb-shaped electrode 2 in the arranged direction of the electrode fingers 2a; and a protective film 4 for covering at least the comb-shaped electrode 2 and the reflective electrodes 3. A pad 5 is electrically connected to the comb-shaped electrode 2 to take an electric signal out of the comb-shaped electrode 2.

The substrate 1 is a lithium tantalate (hereinafter, called as "LT") substrate which is cut of a Y-axis at a certain rotational angle around the X-axis in the Z-axis direction, specifically, a 39° YLT substrate which is cut at a rotational angle of 39°.

The comb-shaped electrode 2 is made of aluminum (hereinafter, called as "Al") or an Al alloy.

The protective film 4 is preferably made of silicon dioxide (hereinafter, called as "$SiO_2$"). As shown in FIG. 1B, the surface of the protective film 4 has convex portions and concave portions. The respective convex portions 4a of the protective film 4 has a flat or a sharp apex portion 6. The apex portions 6 are formed above the electrode fingers 2a on the upper surface of the substrate 1. The concave portions of the protective film 4 are formed at positions between the apex portions 6 where the electrode fingers 2a are not formed on the upper surface of the substrate 1, including positions where the electrode fingers 2a are partly formed on the upper surface of the substrate 1. The respective concave portions has a downward convex curve between the apex portions 6 adjacent to each other.

Now, let it be assumed that the height from the upper surface of the substrate 1 in contact with the protective film 4 to the apex portion 6 of the protective film 4 is t, the height from the upper surface of the substrate 1 in contact with the protective film 4 to a lowermost point of the concave portion of the protective film 4 is t1, and the height (t−t1) from the lowermost point of the concave portion of the protective film 4 to the apex portion 6 is t2.

Also, the height from the upper surface of the substrate 1 in contact with the protective film 4 to a top portion of the electrode finger 2a is defined as the height h of the comb-shaped electrode 2.

Further, the distance from one end of one electrode finger 2a to a corresponding one end of the electrode finger 2a adjacent the one electrode finger 2a is defined as a pitch width P of the comb-shaped electrode 2.

Furthermore, the width of the respective electrode fingers 2a is defined as P1, and the interval between the adjacent electrode fingers 2a is defined as P2 under the condition: P=P1+P2.

A method for manufacturing the SAW device having the above configuration will be described below referring to the drawings.

FIGS. 2A through 2H are diagrams for describing the method for manufacturing the SAW device in the first embodiment.

Figure 2A:
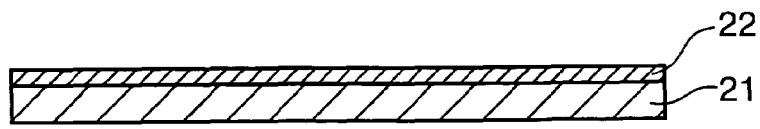
FIGS. 2A through 2H are diagrams for explaining a method for manufacturing the SAW device in the first embodiment of the invention.

First, as shown in FIG. 2A, using a method such as vapor deposition or sputtering, an electrode film 22 as a comb-shaped electrode or/and a reflector which is made of Al or an Al alloy is formed on the upper surface of an LT substrate 21.

Figure 2B:
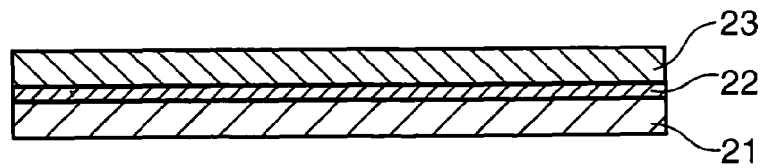

Next, as shown in FIG. 2B, a resist film 23 is formed on the upper surface of the electrode film 22.

Figure 2C:
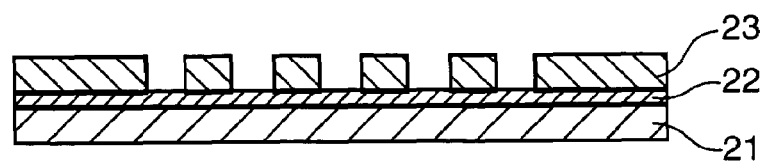

Next, as shown in FIG. 2C, using an exposure-development technique or the like, the resist film 23 is processed so as to turn into an intended shape.

Figure 2D:
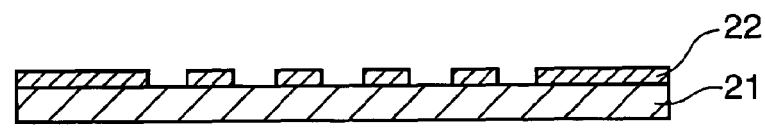

Next, as shown in FIG. 2D, using a dry-etching technique or the like, the electrode film 22 is processed so as to turn into the intended shape such as a comb-shaped electrode or a reflector, and thereafter, the resist film 23 is removed.

Figure 2E:
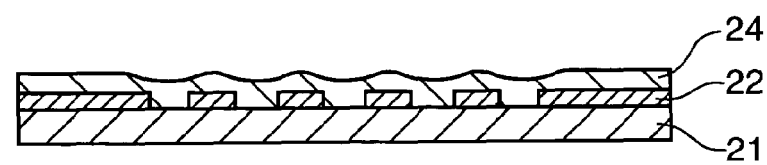

Next, as shown in FIG. 2E, using a method such as vapor deposition or sputtering, a protective film 24 is made of $SiO_2$ so as to cover the electrode film 22.

Figure 2F:
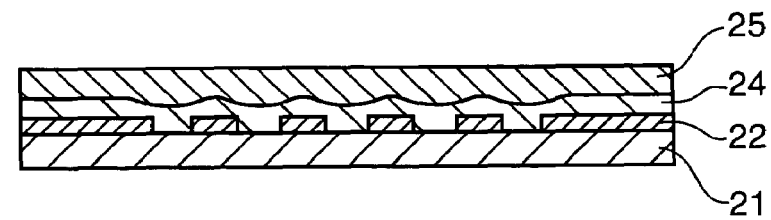

Next, as shown in FIG. 2F, a resist film 25 is formed on the surface of the protective film 24.

Figure 2G:
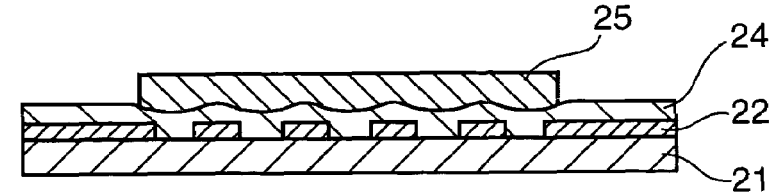

Next, as shown in FIG. 2G, using a technique such as exposure-development, the resist film 25 is processed so as to turn into an intended shape.

Figure 2H:
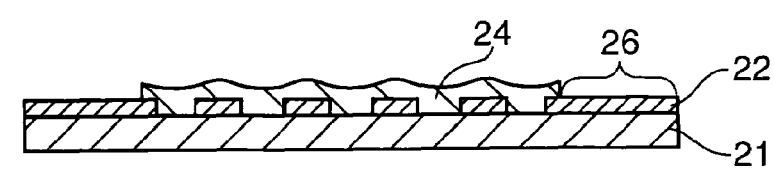

Next, as shown in FIG. 2H, using a dry-etching technique or the like, a protective film which is the part unnecessary for the protective film 24 such as a pad portion 26 for taking out an electric signal, is removed, and thereafter, the resist film 25 is removed.

Finally, using dicing, it is divided into pieces, and thereafter, mounted in a ceramic package using die bonding or the like. After wire bonding, a lid is welded to execute a hermetic seal.

In the first embodiment of the invention, the protective film 4 is formed to improve temperature coefficient. Also, the surface of the protective film 4 has such a configuration that the apex portions 6 are formed above the electrode fingers 2a, and that the concave portions between the adjacent apex portions 6 each has a downward convex curve. With this construction, application of the mass of the protective film 4 is continuously and moderately varied at the concave portions, which suppresses generation of unwanted reflection resulting from the configuration of the protective film 4, thereby preventing degradation of electric characteristics.

Also, forming the apex portions 6 above the electrode fingers 2a enables to increase a reflectance at the electrode fingers 2a owning to the effect of mass loading, thereby enhancing the electric characteristics.

It is desirable to make the center position of the apex portion 6 substantially coincident with the center position of the electrode finger 2a in order to improve the reflectance at the electrode finger 2a.

Also, preferably, the width L1 of the apex portion 6 is smaller than the width P1 of the electrode finger 2a, and more preferably, is set to ¼ or less of the width of the electrode finger 2a to effectively improve the electric characteristics. The width of the apex portion 6 may be substantially zero.

Figure 5:
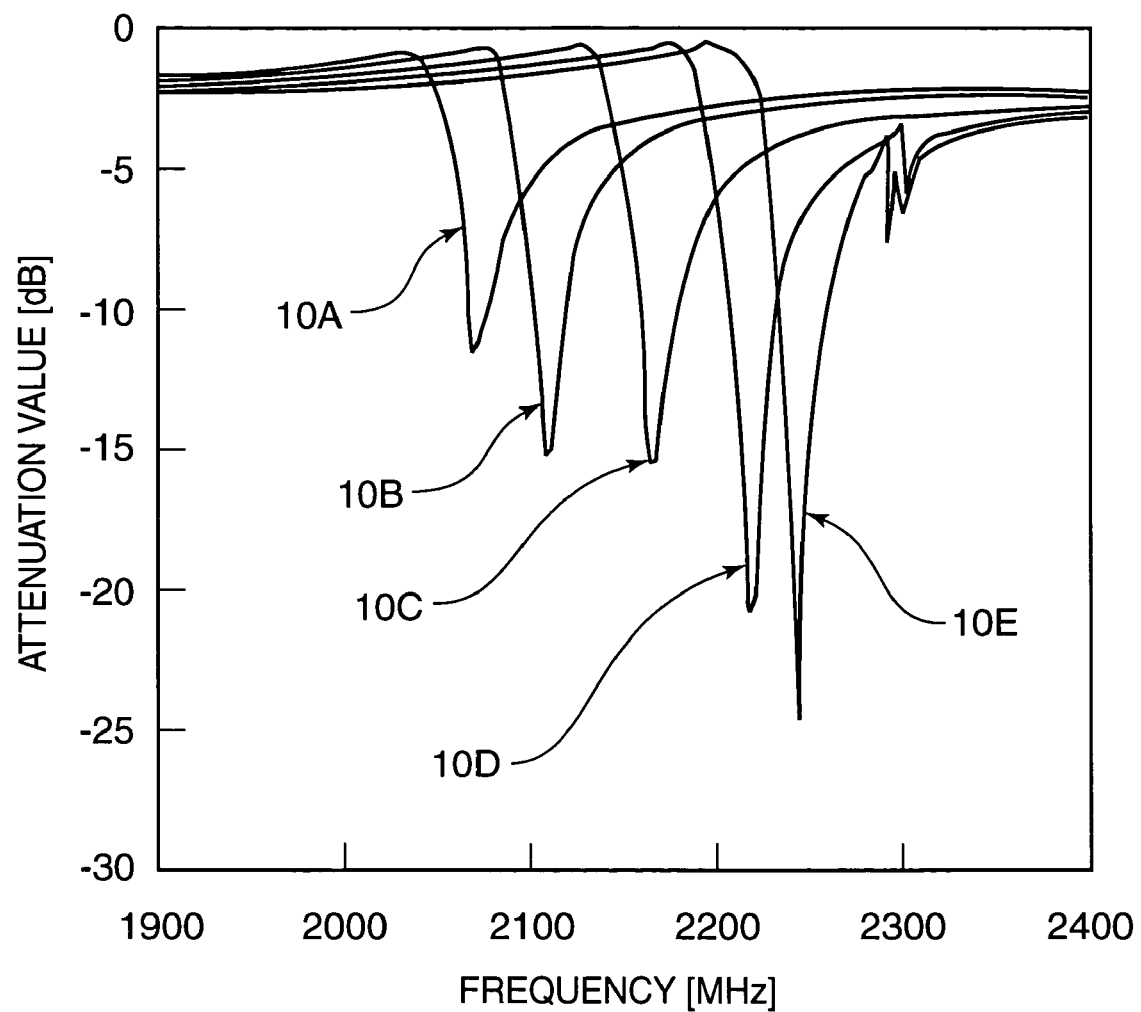
FIG. 5 is a graph showing electric characteristics of the SAW devices shown in FIGS. 3A through 3E.

FIG. 5 shows measurement results on passing characteristics with use of SAW devices 10A through 10E shown in FIGS. 3A through 3E to confirm that the inventive SAW device has improved electric characteristics. As the SAW devices 10A through 10E, used are examples, in which the width P1 (Pa) of the electrode finger 2a is about 0.5 µm, the pitch width P of the comb-shaped electrode 2 is about 1 µm, the height (electrode film thickness) h of the comb-shaped electrode 2 is about 140 nm, and the height t1 from the surface of the substrate 1 to the lowermost point of the concave portion of the protective film 4 is about 400 nm. The configuration of the inventive SAW device is not specifically limited to the above examples, but various modifications may be applicable.

Figure 3A:
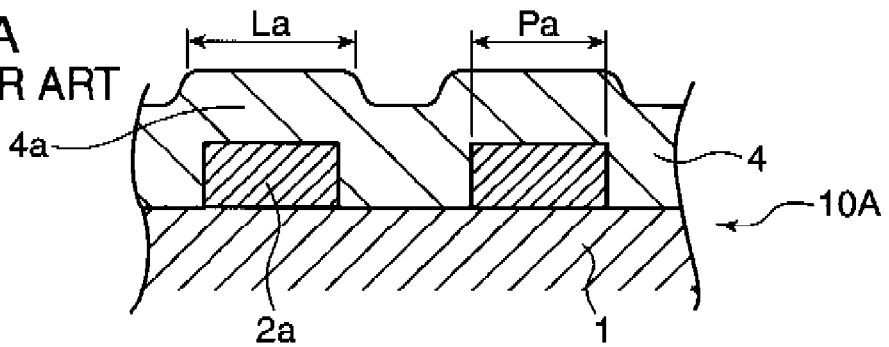
FIG. 3A is a cross-sectional view of a conventional SAW device.
Figure 3B:
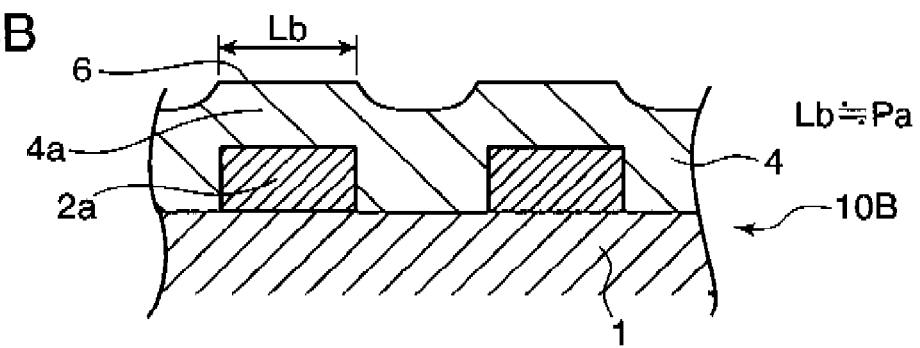
FIGS. 3B through 3E are cross-sectional views of examples of the SAW device in the first embodiment of the invention.
Figure 3C:
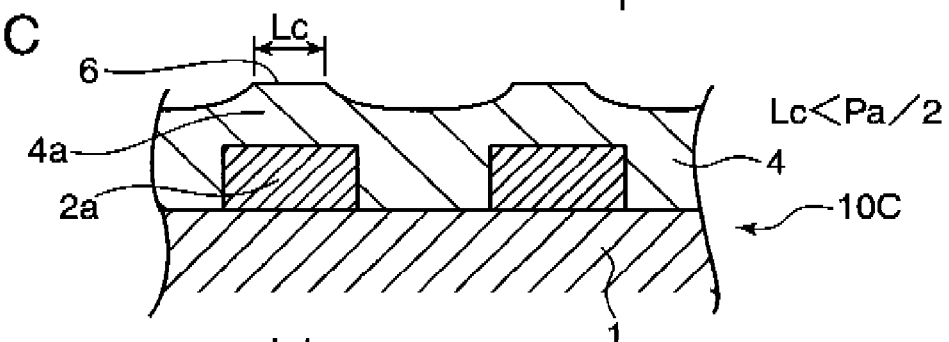
Figure 3D:
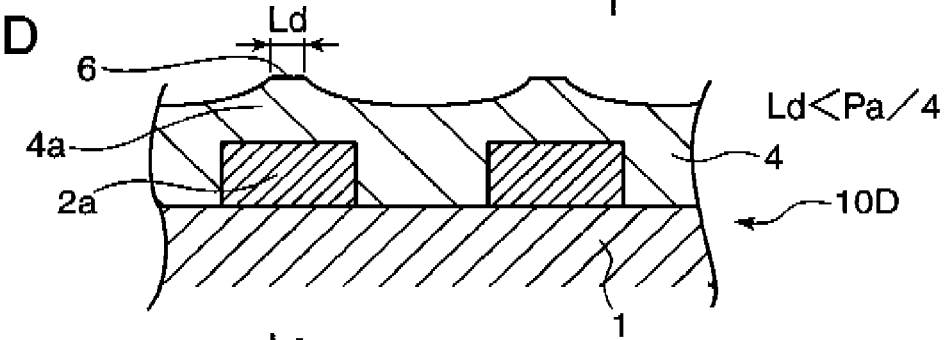
Figure 3E:
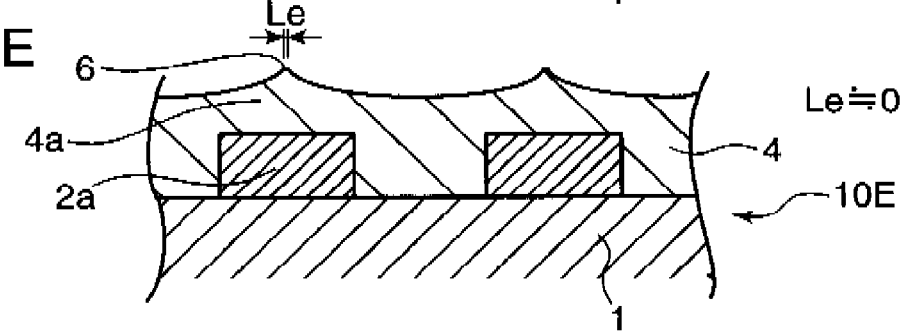
Figure 4:
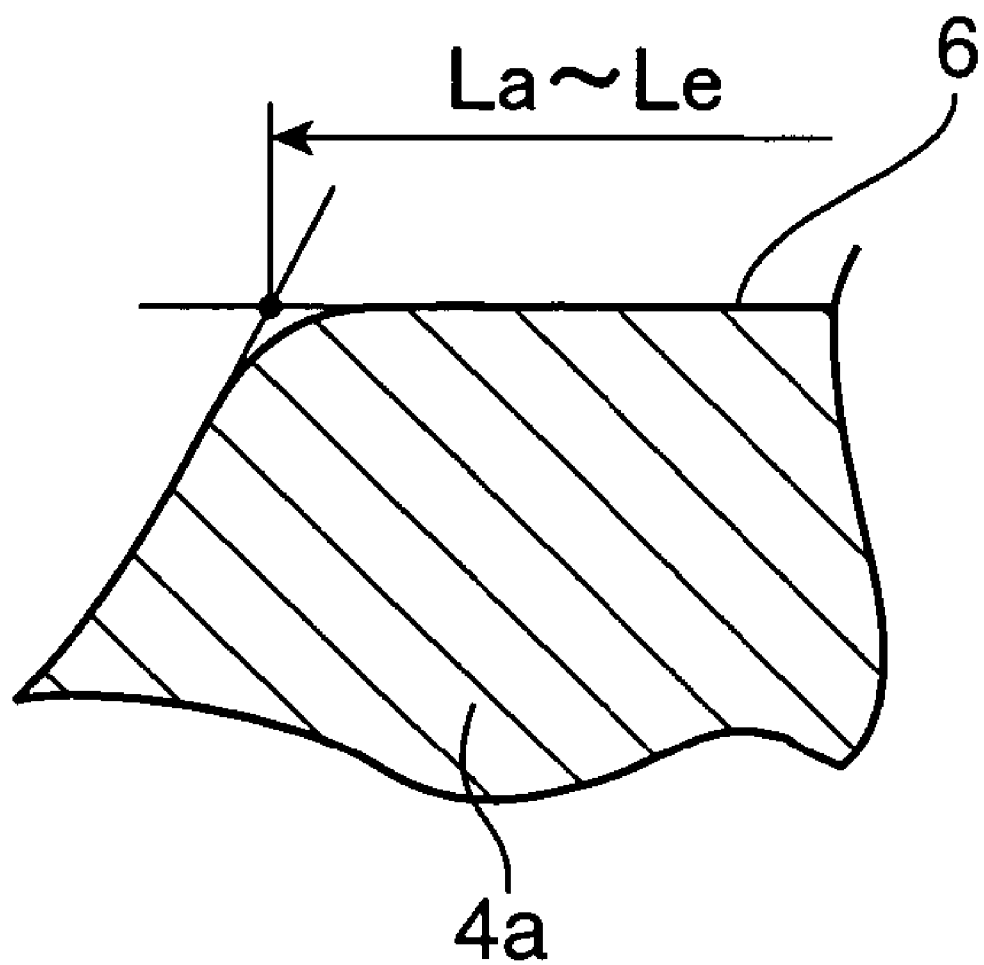
FIG. 4 is a diagram enlargedly showing essential parts of the SAW devices shown in FIGS. 3A through 3E.

The SAW device 10A shown in FIG. 3A is a conventional SAW device, wherein the width La of the apex portion is larger than the width Pa of the electrode finger 2a. The SAW devices 10B through 10E shown in FIGS. 3B through 3E are examples of the SAW device in the first embodiment, wherein the width L1 of the apex portion 6 is varied stepwise. Specifically, concerning the SAW device 10B, the width Lb of the apex portion 6 is substantially equal to the width Pa of the electrode finger 2a; concerning the SAW device 10C, the width Lc of the apex portion 6 is smaller than ½ of the width Pa of the electrode finger 2a; concerning the SAW device 10D, the width Ld of the apex portion 6 is smaller than ¼ of the width Pa of the electrode finger 2a; and concerning the SAW device 10E, the width Le of the apex portion 6 is substantially zero. As shown in FIG. 4, the width La, Lb, Lc, Ld, Le of the apex portion 6 corresponds to a distance measured from a point at which a line extending from the curve of the concave portion intersects with a line extending from a line constituting the apex portion 6 in parallel to the upper surface of the substrate 1.

As shown in FIG. 5, as the width of the apex portion 6 is decreased, the attenuation value in anti-resonance is largely increased and steeply changed, which clearly shows that the electric characteristics are improved.

Observing a relationship between the height t2 from the lowermost point of the concave portion of the protective film 4 to the apex portion 6, and the electric characteristic, the example in which t2 is normalized by a wavelength (2×P), i.e. the example satisfying a requirement: $t2/(2 \times P) \leq 0.01$ hardly shows an improvement on the reflectance, as compared with the example in which the surface of the protective film 4 is made flat. Accordingly, $t2/(2 \times P)$ is required to be larger than 0.01, and more preferably be 0.015 or larger. As t2 is increased, the reflectance can be improved. However, an additional step of forming the $SiO_2$ film with the predetermined shape e.g. a step of etching the protective film 4 is required in addition to the steps of the aforementioned manufacturing method in order to make t2 equal to or larger than the film thickness h of the comb-shaped electrode, which makes the manufacturing method cumbersome. In view of this, it is desirable to set t2 so that a requirement: $0.01 < t2/(2 \times P) < h/(2 \times P)$ is satisfied.

Also, the inventors produced SAW devices, using LT substrates having different cut angles to show a relationship between electric characteristics and cut angles of substrates of the SAW devices having the cut angle of the substrate 1 and the protective film 4 with the configuration shown in the first embodiment.

By producing the above examples, the inventors confirmed that an increase in the cut angle of the substrate 1 over 34° greatly improves the attenuation value and steepness. In particular, concerning the SAW devices used in the first embodiment, a preferred cut angle of the substrate is about 38° or more to attain the attenuation value of −20 dB or more, which is about 80% of the attenuation value obtained in the example without formation of an $SiO_2$ film. Based on the above results, the inventors confirmed that desirable temperature coefficient and electric characteristics are obtained in use of a D° YLT substrate, as the substrate 1, which satisfies the requirement that the substrate is an LT substrate cut of a Y-axis with a rotational angle of D° around the X-axis in the Z-axis direction, wherein the rotational angle D° is 38° or larger.

The inventors also confirmed that concerning a relationship between the film thickness h of the electrode finger 2a, and the configuration of the protective film, a smaller h makes it difficult to form the apex portion, and that a requirement: $h/(2 \times P) \geq 0.05$ is required to make $t2/(2 \times P)$ equal to or larger than 0.01. Conversely, if $h/(2 \times P)$ exceeds 0.15, it is difficult to form a smooth curve. In the first embodiment, the relationship between the thickness of the electrode film and the configuration of the protective film has been described, using aluminum as an electrode material. A similar relationship as mentioned above is obtained in the case where an aluminum alloy is used as the electrode material, or in the case where a laminated layer including aluminum or an aluminum alloy, and other material, or a metallic film made of a material other than aluminum is used.

Next, SAW devices were produced, in which the widths of the apex portions are zero, and the thicknesses t of the $SiO_2$ films are different one from another to show a relationship between the thicknesses of the $SiO_2$ films, and temperature and electric characteristics. Temperature coefficient of the SAW devices in center frequencies thereof were measured. A list concerning normalized thicknesses: $t/(2 \times P)$ of the $SiO_2$ films, electromechanical coupling coefficients $k^2$, and temperature coefficient of the respective SAW devices is shown in Table 1.

TABLE 1

| | $t (2 \times P)$ (%) | $k^2$ (%) | temperature coefficient (ppm/° K) |
|---|---|---|---|
| Comparative Example | 0.0 | 7.6 | −36.4 |
| Example 1 | 10.0 | 6.6 | −28.6 |
| Example 2 | 20.0 | 6.3 | −14.9 |
| Example 3 | 30.0 | 5.0 | 5.2 |

Figure 6:
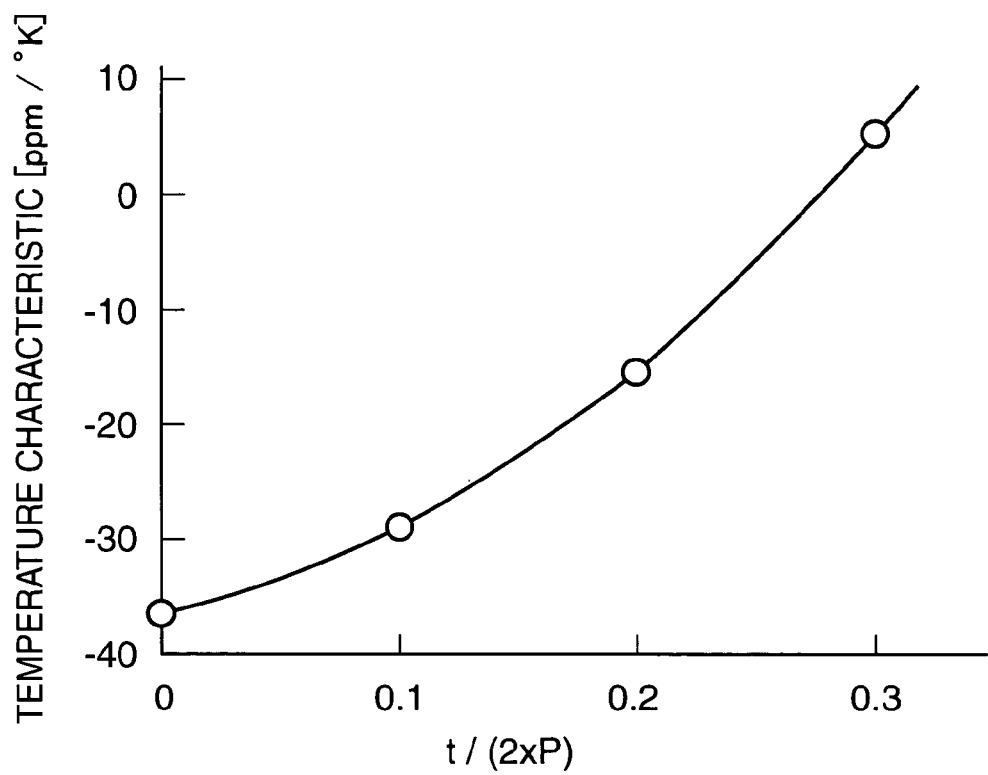
FIG. 6 is a diagram showing a relationship between structures and electric characteristics of the SAW device in the first embodiment of the invention.

FIG. 6 is a graph showing a relationship between thicknesses of $SiO_2$ films which are normalized by a wavelength, and temperature coefficient. FIG. 6 shows that an increased thickness of the $SiO_2$ film improves the temperature coefficient. In particular, if the normalized thickness of the $SiO_2$ film is about 0.09 or larger, the absolute value of the temperature coefficient is 30 ppm/° K or less, and the temperature coefficient is zero when the normalized thickness of the $SiO_2$ film is about 0.27.

Figure 7:
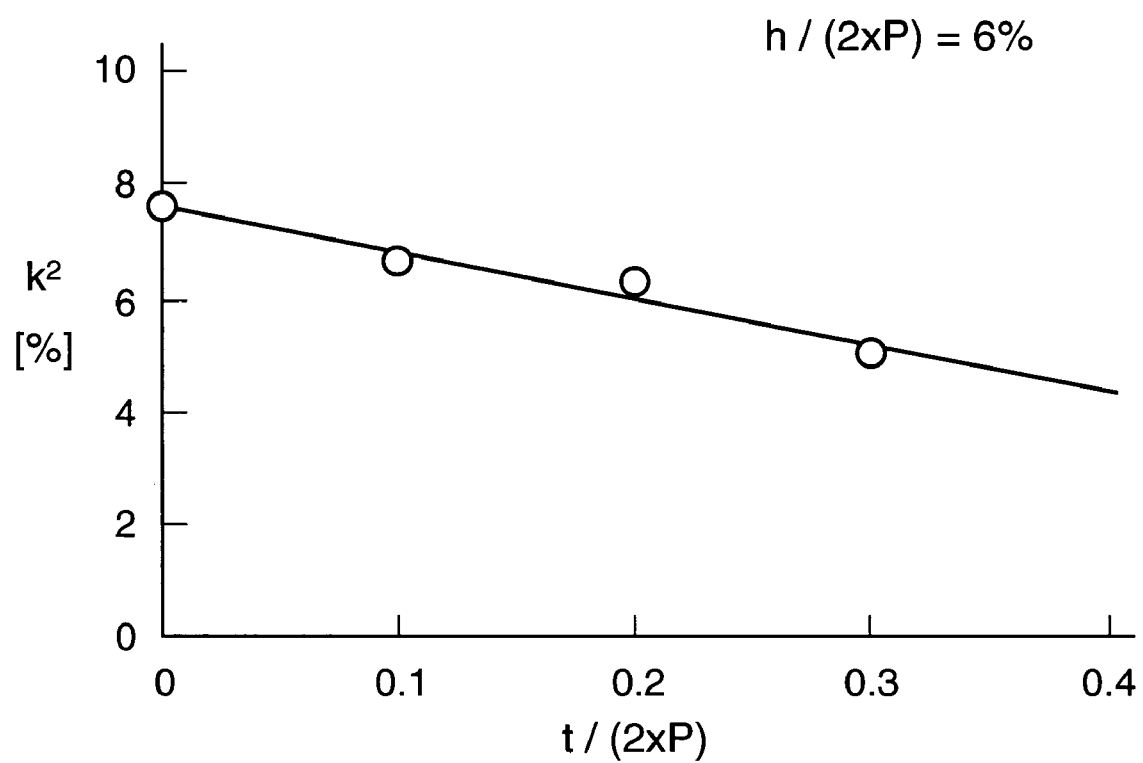
FIG. 7 is a diagram showing a relationship between structures and electric characteristics of the SAW device in the first embodiment of the invention.

FIG. 7 is a graph showing a relationship between thicknesses of $SiO_2$ films which are normalized by a wavelength, and electromechanical coupling coefficients $k^2$ under a condition that the normalized thickness of the electrode is 6%. FIG. 7 shows that an increased thickness of the $SiO_2$ film lowers the electromechanical coupling coefficient $k^2$. As the electromechanical coupling coefficient $k^2$ is decreased, steepness is increased. When a ladder type SAW filter is configured, using the SAW device having the property, a bandwidth of the SAW filter is narrowed.

An electromechanical coupling coefficient of about 6% or more is preferred to secure the bandwidth of the filter required in the currently prevailing mobile phone system. FIG. 7 shows that the electromechanical coupling coefficient of 6% is obtained if the normalized thickness of the $SiO_2$ film is about 20% or less, and that the electromechanical coupling coefficient is lowered than 5% if the normalized thickness of the $SiO_2$ film exceeds about 30%, which shows that securing the required band for the filter is extremely difficult. On the other hand, an unduly large electromechanical coupling coefficient $k^2$ results in loss of steepness, despite securing a wider bandwidth. As a result, smooth transition from a passing band to an attenuation band is obstructed in a transmission band and a reception band, which causes disadvantages that sufficient suppression may not be obtained in the attenuation band, or that a loss in the passing band may be increased. Also, taking the temperature coefficient into account, a transition band from the passing band to the attenuation band which is allowable for a filter characteristic is required not to exceed a value obtained by subtracting a drift frequency bandwidth resulting from a change in the temperature from a frequency gap between the transmission band and the reception band. In view of this, considering the relationships shown in FIGS. 6 and 7, preferably, the thickness of the $SiO_2$ film satisfies the requirements that the electromechanical coupling coefficient $k^2$ is about 5% or more, and that the absolute value of the temperature coefficient is about 30 ppm/° K or less.

Based on the above results, the inventors confirmed that desirable temperature coefficient and electric characteristics are obtained in the case where the $SiO_2$ film is used as the protective film, and the requirement: $0.09 \leq t/(2 \times P) \leq 0.3$ is satisfied where t is the thickness of the protective film defined by the height from the surface of the substrate to the concave portion of the protective film. Further, satisfying the requirement: $0.12 \leq t/(2 \times P) \leq 0.2$ is more preferred to set the electromechanical coupling coefficient $k^2$ to about 6% or more, and to set the absolute value of the temperature coefficient to about 25 ppm/° K or less.

In the foregoing embodiment, the LT substrate is used as the substrate, and the $SiO_2$ film is used as the protective film. The invention is not limited to the above. The idea of the invention may be applicable to substrates and protective films other than the above. In such a case, it is needless to say that optimal conditions differ depending on material characteristics of the respective substrates and the respective protective films.

Second Embodiment

In this section, an SAW device in the second embodiment of the invention is described referring to the drawings.

In the second embodiment, an SAW device substantially identical to the SAW device in the first embodiment is used. The method for manufacturing the SAW device in the second embodiment is substantially equivalent to the method described in the first embodiment except for the following. Specifically, a so-called bias sputtering method of forming a film by sputtering, with a bias voltage being applied on the substrate side in forming an $SiO_2$ film, as illustrated in FIG. 2E, is used in a method for manufacturing an SAW device comprising a substrate; a comb-shaped electrode formed on the upper surface of the substrate; and a protective film which covers the comb-shaped electrode, and has convex portions and concave portions on an upper surface thereof, wherein an uppermost surface of the protective film has, in cross section in a direction orthogonal to an extending direction of electrode fingers constituting the comb-shaped electrode, a configuration that apex portions are formed above the electrode fingers, and the adjacent apex portions are connected to each other by a downward convex curve.

$SiO_2$ is deposited on a substrate 21 by sputtering a targeted $SiO_2$, and at the same time, a part of the $SiO_2$ on the substrate 21 is sputtered by applying a bias voltage. Specifically, the configuration of the $SiO_2$ film is controlled by removing the part of the $SiO_2$ while depositing the $SiO_2$. The configuration of the $SiO_2$ film may be controlled by changing a ratio of a bias voltage to be applied to the substrate relative to a sputtering electric power in the course of depositing the $SiO_2$, or by forming an $SiO_2$ film without applying a bias voltage in an initial stage of film formation, and applying a bias voltage at a certain point of time in the course of the film formation. In controlling the configuration of the $SiO_2$ film, the temperature of the substrate is also controlled.

For instance, a mixed gas containing argon and oxygen is used as a sputtering gas, and a pressure of the mixed gas is set to 0.5 Pa. In forming an $SiO_2$ film at a rate of about 15 nm/min, an RF power is constantly set to 3,000 W, and a bias power is changed in such a manner that the bias power is gradually increased from a predetermined value. Alternatively, an $SiO_2$ film may be formed without applying a bias voltage in an initial stage of film formation, and a bias power may be set to 150 W at a certain point of time in the course of the film formation.

Thus, it was confirmed that an intended configuration of an $SiO_2$ film can be obtained solely by performing the film formation process without performing a post process, by using the bias sputtering method and forming the $SiO_2$ film under an appropriate film formation condition. Also, it was confirmed that the thus manufactured SAW device has desirable electric characteristics and temperature coefficient.

The invention enables realization of an electronic part having superior temperature coefficient and electric characteristics by forming the protective film in such a manner as to cover the electrode formed on the substrate, and by forming the protective film into the predetermined shape. Thus, the invention is industrially useful.

The invention claimed is:

1. An electronic part comprising:
    a substrate having an upper surface;
    a comb-shaped electrode having a plurality of electrode fingers arranged parallel to one another on the upper surface of the substrate; and
    a protective film disposed on the upper surface of the substrate so as to cover the comb-shaped electrode, wherein the protective film has convex portions and concave portions in cross section in a direction orthogonal to an extending direction of the electrode fingers, the convex portions being upwardly convex at positions corresponding to the electrode fingers, and the concave portions having a downward convex curve between apex portions of the convex portions, and wherein
    a width of the apex portion is smaller than a width of the electrode finger.

2. The electronic part according to claim 1, wherein a center position of the apex portion is substantially coincident with a center position of the electrode finger.

3. The electronic part according to claim 1, wherein the electronic part satisfies a requirement: $0.05 < h/(2 \times P) < 0.15$ where P is a pitch of the electrode fingers of the comb-shaped electrode, and h is a film thickness of the comb-shaped electrode.

4. The electronic part according to claim 1, wherein the electronic part satisfies a requirement: $0.09 \leq t/(2 \times P) \leq 0.3$ where t is a height from the upper surface of the substrate to the apex portion, and P is a pitch of the electrode fingers of the comb-shaped electrode.

5. The electronic part according to claim 1, wherein the electronic part satisfies a requirement: $0.12 \leq t/(2 \times P) \leq 0.2$ where t is a height from the upper surface of the substrate to the apex portion, and P is a pitch of the electrode fingers of the comb-shaped electrode.

6. The electronic part according to claim 1, wherein the electronic part is a surface acoustic wave device.

7. An electronic part comprising:
    a substrate having an upper surface;
    a comb-shaped electrode having a plurality of electrode fingers arranged parallel to one another on the upper surface of the substrate; and
    a protective film disposed on the upper surface of the substrate so as to cover the comb-shaped electrode, wherein:
    the protective film has convex portions and concave portions in cross section in a direction orthogonal to an extending direction of the electrode fingers, the convex portions being upwardly convex at positions corresponding to the electrode fingers, and the concave portions having a downward convex curve between apex portions of the convex portions, and the electronic part satisfies a requirement: $0.01 < X/(2 \times P) < h/(2 \times P)$ where X is a height from a lowermost point of the curve to the apex portion, P is a pitch of the electrode fingers of the comb-shaped electrode, and h is a film thickness of the comb-shaped electrode.

8. The electronic part according to claim 7, wherein a center position of the apex portion is substantially coincident with a center position of the electrode finger.

9. The electronic part according to claim 7, wherein the electronic part satisfies a requirement: $0.05 < h/(2 \times P) < 0.15$.

10. The electronic part according to claim 7, wherein the electronic part satisfies a requirement: $0.09 \leq t/(2 \times P) \leq 0.3$ where t is a height from the upper surface of the substrate to the apex portion.

11. The electronic part according to claim 7, wherein the electronic part satisfies a requirement: $0.12 \leq t/(2 \times P) \leq 0.2$ where t is a height from the upper surface of the substrate to the apex portion.

12. The electronic part according to claim 7, wherein the electronic part is a surface acoustic wave device.

* * * * *